(12) United States Patent
Brederlow et al.

(10) Patent No.: US 7,688,625 B2
(45) Date of Patent: Mar. 30, 2010

(54) CIRCUIT ARRANGEMENT AND METHOD FOR OPERATING A CIRCUIT ARRANGEMENT

(75) Inventors: Ralf Brederlow, Poing (DE); Roland Thewes, Groebenzell (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 12/032,202

(22) Filed: Feb. 15, 2008

(65) Prior Publication Data

US 2008/0198653 A1 Aug. 21, 2008

(30) Foreign Application Priority Data

Feb. 15, 2007 (DE) .................. 10 2007 007 585

(51) Int. Cl.
*G11C 16/04* (2006.01)
*G11C 5/14* (2006.01)

(52) U.S. Cl. .................. 365/185.03; 365/185.28; 365/226

(58) Field of Classification Search ............. 365/185.03
See application file for complete search history.

(56) References Cited

U.S. PATENT DOCUMENTS 5,428,252 A * 6/1995 Walker et al. ................. 307/64
6,081,448 A * 6/2000 Pasotti et al. ............ 365/185.03
6,118,315 A 9/2000 Guedj
6,426,908 B1 * 7/2002 Hidaka ........................ 365/222
6,560,157 B2 * 5/2003 Sugita et al. ................. 365/226

OTHER PUBLICATIONS

Brox et al., "A Model for the Time- and Bias-Dependence of p-MOSFET Degradation," IEEE Trans. Electron Devices, vol. 41, No. 7, 1994, pp. 1184-1196.
Hofmann et al., "Hot-Electron and Hole Emission Effects in Short n-Channel MOSFETs," IEEE Trans. Electron Devices, vol. 32, No. 3, 1985, pp. 691-699.
S.M. Sze, "Physics of Semiconductor Devices, Second Edition," John Wiley & Sons, New York, 1981, pp. 496-504.
Roland Thewes, "Degradation analoger CMOS-Schaltungen durch heisse Ladungstraeger," Dissertation Universitaet Dortmund, Kapitel 3 und 4, 1995, pp. 21-47.

* cited by examiner

*Primary Examiner*—Son L Mai
(74) *Attorney, Agent, or Firm*—Dickstein, Shapiro, LLP.

(57) ABSTRACT

A circuit arrangement includes a nonvolatile memory cell having a continuously variable characteristic that can be read out. A programming unit is coupled to the memory cell and designed to apply an analog signal to the memory cell in order to vary the characteristic, if the characteristic lies within a predetermined range of values, in such a way that the characteristic lies outside the predetermined range of values. A supply voltage unit is provided for providing a supply voltage. A changeover unit is coupled to the supply voltage unit and to the programming unit and designed to trigger the application of the analog signal to the memory cell if the supply voltage is interrupted.

16 Claims, 11 Drawing Sheets

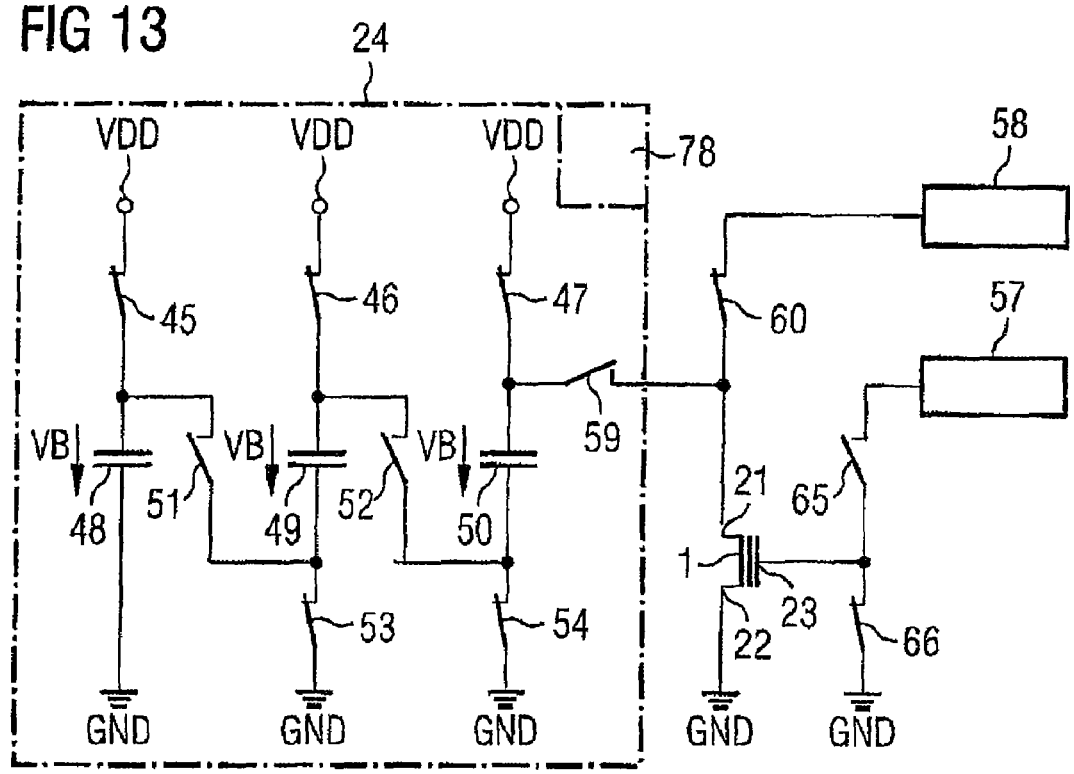
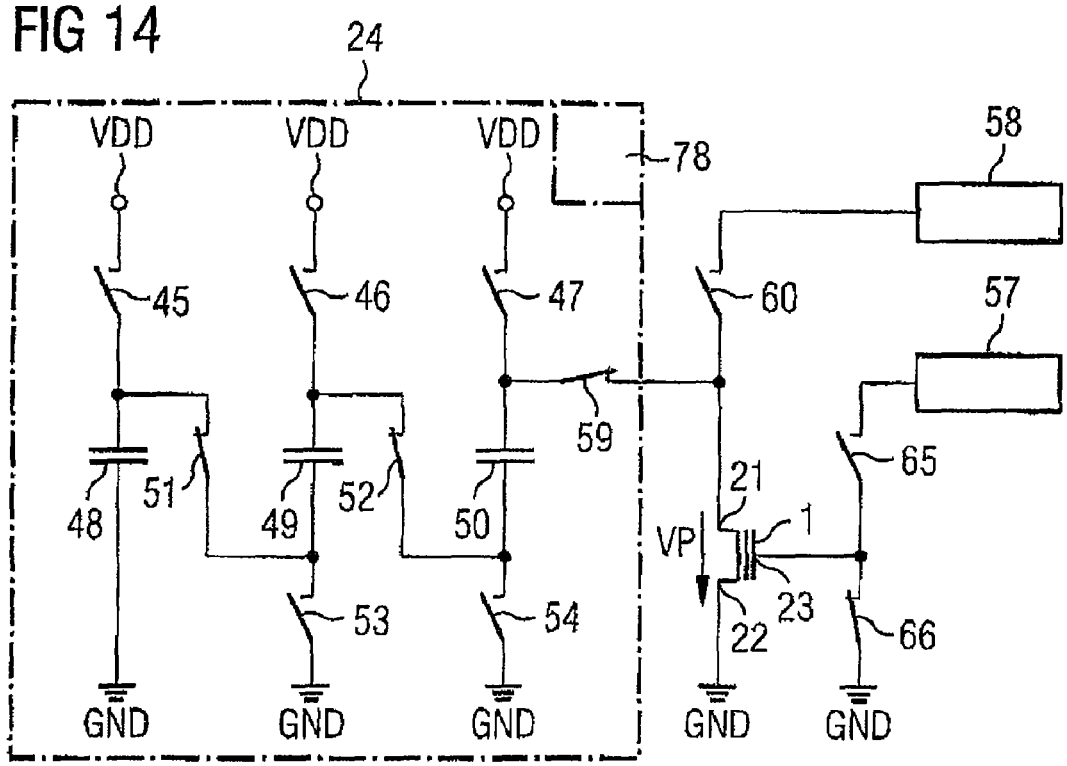

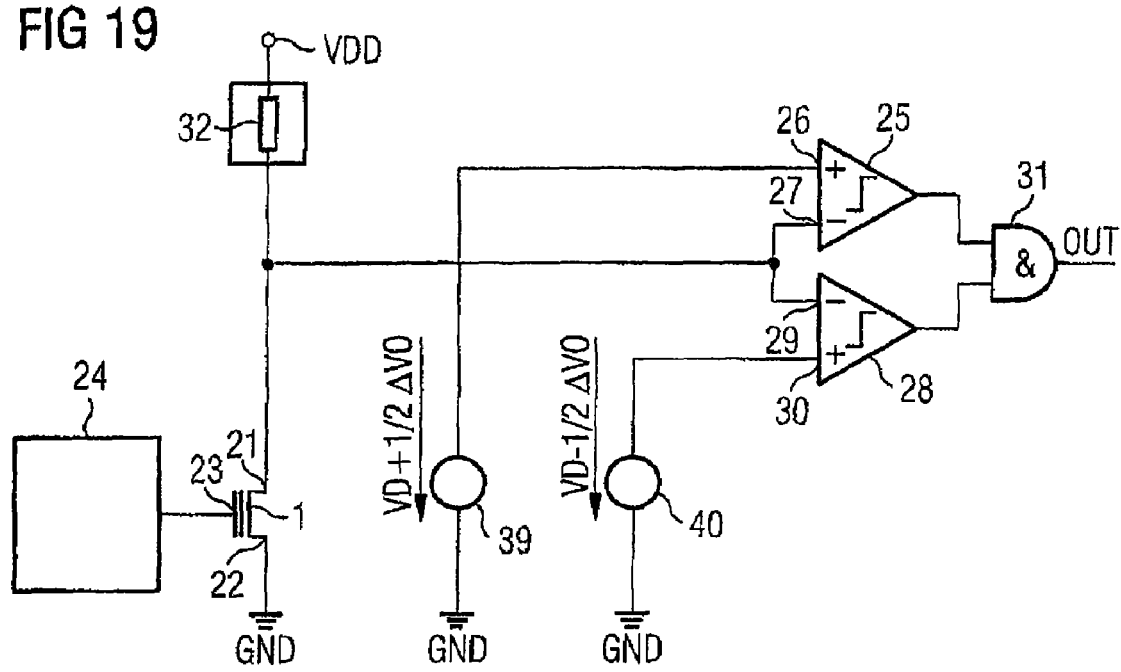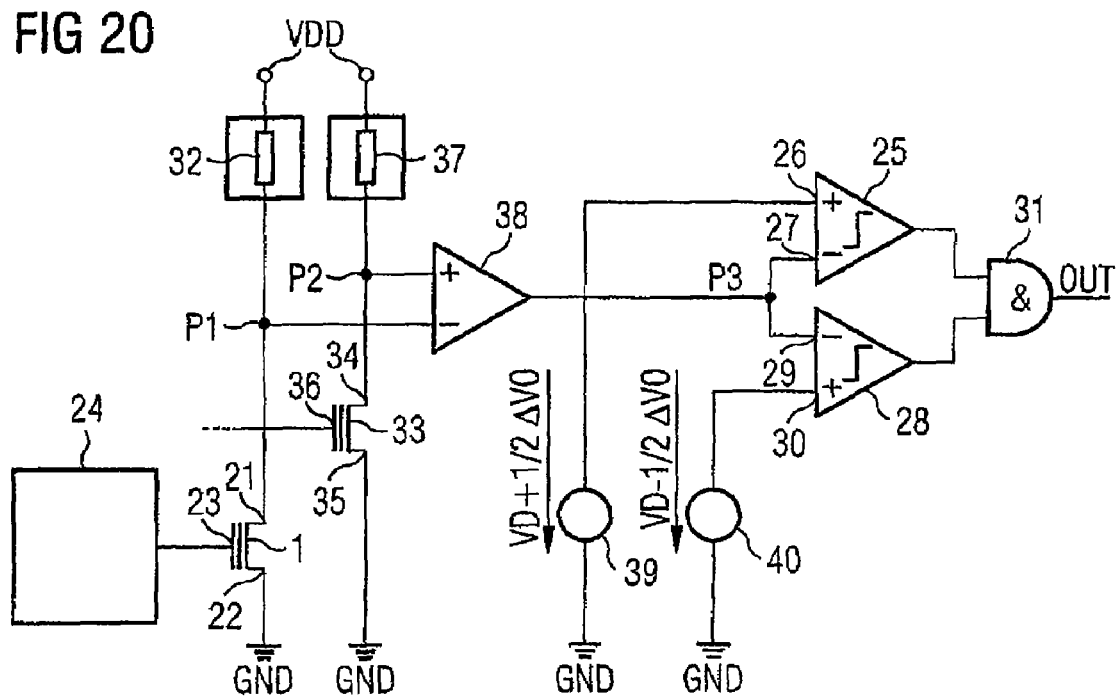

CIRCUIT ARRANGEMENT AND METHOD FOR OPERATING A CIRCUIT ARRANGEMENT

FIELD OF THE INVENTION

The invention relates to a circuit arrangement and a method for operating a circuit arrangement.

BACKGROUND

Smart cards in security-relevant applications can be subjected to attacks in which an attacker attempts, in an unauthorized manner, to read or alter information stored on the card. In order to repel an attack, smart cards can be provided with a series of electronic protection systems which identify such an attack and switch the card into a so-called power-down operation mode. In power-down operation, the provision of the operating voltage is interrupted, such that the operation of the smart card is terminated and the attack is repelled.

When the smart card is operated again after such a termination of operation, it is possible to signal that an attack took place, in order, if appropriate, to provide measures against further attacks. For signaling purposes, the information that an attack took place is provided in a nonvolatile memory element.

When storing such an item of information for the nonvolatile memory elements, well-defined voltage and timing conditions which permit a process of writing to the nonvolatile memory by the methods on which the smart card is usually based are possibly no longer ensured on the smart card in the case where an attack was identified and power-down operation was initiated.

BRIEF DESCRIPTION OF THE DRAWINGS

The invention is explained below on the basis of some exemplary embodiments with reference to the drawings.

FIG. 13 shows a schematic illustration of a further exemplary embodiment of a circuit arrangement with a first switch position.

FIG. 14 shows a schematic illustration of the further exemplary embodiment of the circuit arrangement with a second switch position.

FIG. 19 shows a schematic illustration of an exemplary embodiment of a circuit arrangement.

FIG. 20 shows a schematic illustration of a further exemplary embodiment of a circuit arrangement.

DETAILED DESCRIPTION

Figure 1:
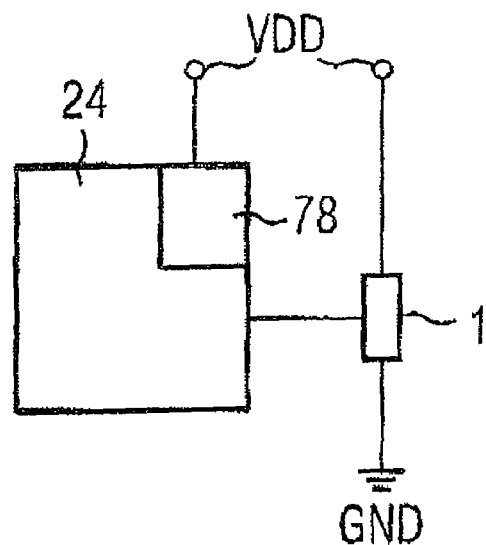
FIG. 1 shows a schematic illustration of an exemplary embodiment of a circuit arrangement.

FIG. 1 shows a schematic illustration of an exemplary embodiment of a circuit arrangement. The circuit arrangement comprises a nonvolatile memory cell 1 having a continuously variable characteristic that can be read out. A supply voltage unit VDD is provided for providing a supply voltage. A programming unit 24 is coupled to the memory cell 1 and designed to apply an analog signal VP to the memory cell 1 in order to vary the characteristic, if it lies within a predetermined range of values, in such a way that the characteristic read out lies outside the predetermined range of values. A changeover unit 78 is coupled to the supply voltage unit VDD and to the programming unit 24 and designed to trigger the application of the analog signal VP to the memory cell 1 if the supply voltage is interrupted.

In the case of the circuit arrangement, an attack that took place can be signaled upon the booting of the circuit arrangement since, given a small range of values, the analog signal provided under unstable power-down operation conditions has the effect that the characteristic is shifted from the range of values.

In one exemplary embodiment, a reading unit is provided, which is coupled to the nonvolatile memory cell in order to detect whether the characteristic read out lies outside the range of values.

Figure 2:
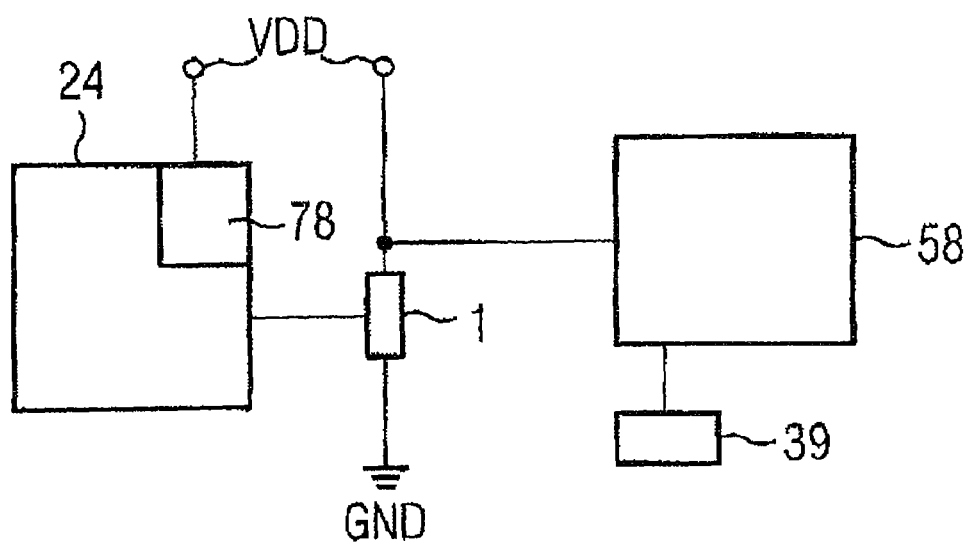
FIG. 2 shows a schematic illustration of an exemplary embodiment of a circuit arrangement.

FIG. 2 shows a schematic illustration of a further exemplary embodiment of a circuit arrangement. The circuit arrangement comprises a nonvolatile memory cell 1 having a continuously variable characteristic that can be read out, and a provision means 39 for providing an item of information specifying a range of values. A reading unit 58 is coupled to the nonvolatile memory cell 1 and the provision means 39 in order to detect whether the characteristic read out lies outside the range of values. A supply voltage unit VDD is provided for providing a supply voltage. A programming unit 24 is coupled to the memory cell 1 and designed to apply an analog signal VP to the memory cell 1 in order to vary the characteristic, if it lies within a predetermined range of values, in such a way that the characteristic read out lies outside the range of values. A changeover unit 78 is coupled to the supply voltage unit VDD and to the programming unit 24 and designed to trigger the application of the analog signal VP to the memory cell 1 if the supply voltage is interrupted.

In the event of an attack, the attacker possibly repeats a series of attacks in a short time, wherein different parameters of the attack can be varied combinatorially and systematically until a combination of said parameters leads to success.

One strategy for significantly reducing the probability of a successful attack through such a sequence of attacks is to store the information that an attack took place on the card and to delay a booting process of the card upon the next start-up by a period of time in the region of a few seconds, such that the number of possible attacks per time is considerably reduced.

In one exemplary embodiment, the reading unit, for evaluating the characteristic, comprises a read-out means with a potential node, which is coupled to the memory cell in order to read out the characteristic and to provide a characteristic value at the potential node. Furthermore, the reading unit comprises a comparison unit, which is coupled to the potential node and the provision means for providing an item of information specifying the range of values and detects whether the characteristic value lies outside the range of values.

For the differential evaluation of the characteristic, in one exemplary embodiment a reference cell is provided in the read-out means, the characteristic of said reference cell not being changed when the supply voltage is interrupted. In this way, fluctuations of the operating temperature, of the operating voltage or ageing processes affect the memory cell and the reference cell to the same extent. Incorrect interpretations of the state of the characteristic that can stem from effects mentioned above are thus avoided.

In one exemplary embodiment, the characteristic read out or the difference between the characteristic quantities of the memory cell and of the reference cell are fed to the comparison unit in order to compare them with the range of values, and on the basis thereof to deduce an attack that possibly took place.

In one exemplary embodiment, the comparison is affected by means of a comparator and relates only to a threshold value of the range of values that is open at one end. As an alternative, the comparison can be carried out by means of a so-called mirror comparator for a narrow interval, which can be realized in a simple manner in terms of circuit technology.

In a further exemplary embodiment, an analog-to-digital converter is provided, which outputs a first digital value. Said value is compared with a second digital value stored in the provision means. A discretization of the characteristic read out is performed by means of the analog-to-digital conversion. Differences between the first and the second digital value indicate a change in the characteristic that took place beforehand.

In one exemplary embodiment, a control unit is provided, which is designed to change the stored second digital value. In this way, the first digital value determined can be stored as, now changed, second digital value, such that resetting of the memory cell is not necessary. At the same time, this type of memory device makes it possible to monitor the lifetime of the memory cell.

A reset device is provided in one exemplary embodiment in order to reset the characteristic into the range of values again. This is necessary if an attack has been detected, in order to be able to detect a renewed attack.

In one exemplary embodiment, the programming unit comprises a charge pump, which, when the supply voltage collapses, provides a high programming voltage pulse in order to vary the state of the memory cell.

In one exemplary embodiment, the memory cell comprises a first terminal, a second terminal and a gate terminal. The first terminal is connected or can be connected to the reading unit and is connected or can be connected to the programming unit. The second terminal is connected or can be connected to a first programming potential, and the gate terminal is connected or can be connected to a second programming potential. Consequently, it is possible to change over between readout and programming. This circuitry permits the memory cell to be programmed by means of so-called hot hole programming, which is associated with a low channel current and a short programming duration.

In one exemplary embodiment, the programming potential provided by the analog signal is greater than that present at the gate terminal, in order to provide the conditions necessary for hot hole injection. The configuration can be implemented particularly simply in terms of circuit technology if both the gate terminal and the second terminal are at a reference potential.

In another exemplary embodiment, the analog signal is applied to the gate terminal in order to utilize Fowler-Nordheim programming, in which virtually no channel currents whatsoever occur.

In one exemplary embodiment, a reset unit is provided, which can be connected to the gate terminal in order to vary the characteristic in such a way that it lies within the range of values again.

A method provides for operating a circuit arrangement comprising a memory cell and comprises programming said memory cell.

The programming comprises testing whether a supply voltage provided is interrupted. If the supply voltage provided is interrupted, an analog signal is provided, which is applied to the memory cell in order to vary the characteristic lying within the range of values, such that the characteristic lies outside the range of values.

One exemplary method provides for reading from the memory cell. The read-out comprises providing an item of information specifying the range of values, and reading out the characteristic. The method furthermore involves detecting whether the characteristic read out lies outside the range of values.

One exemplary embodiment involves carrying out the comparison of the range of values with the characteristic read out, which is associated with little outlay in terms of circuit technology. An alternative exemplary embodiment involves carrying out the comparison with the difference between the characteristic read out and a reference characteristic, which significantly reduces interference effects.

The analog-to-digital conversion can be used in the method, too. The characteristic read out or the difference is converted into a first digital value.

Figure 3:
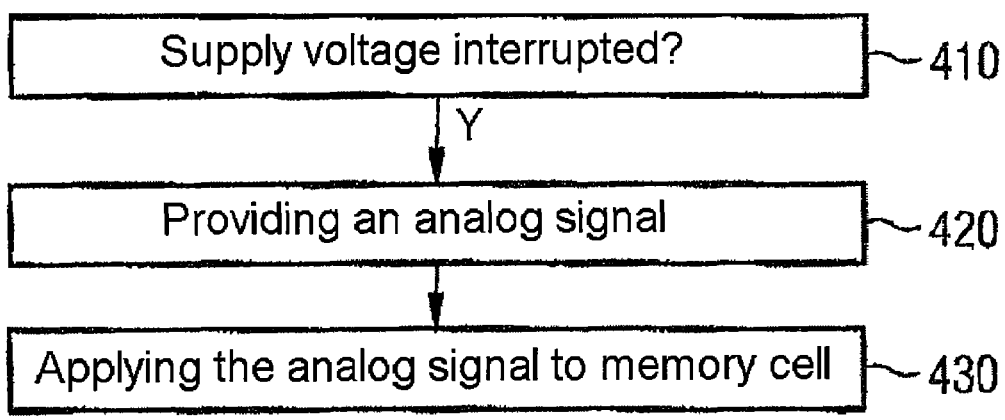
FIG. 3 shows a flow chart of an exemplary embodiment of programming a memory cell.

FIG. 3 shows a flow chart of an exemplary embodiment of programming a nonvolatile memory cell in a circuit arrangement. The memory cell has a continuously variable characteristic that can be read out and lies within a predetermined range of values. The method comprises programming the memory cell and reading from the memory cell.

Programming comprises testing whether a supply voltage provided is interrupted, see block 410. An analog signal is provided if the supply voltage provided is interrupted, see block 420. The analog signal is applied to the memory cell in order to vary the characteristic lying within the range of values, such that the characteristic lies outside the range of values, see block 430.

Figure 4:
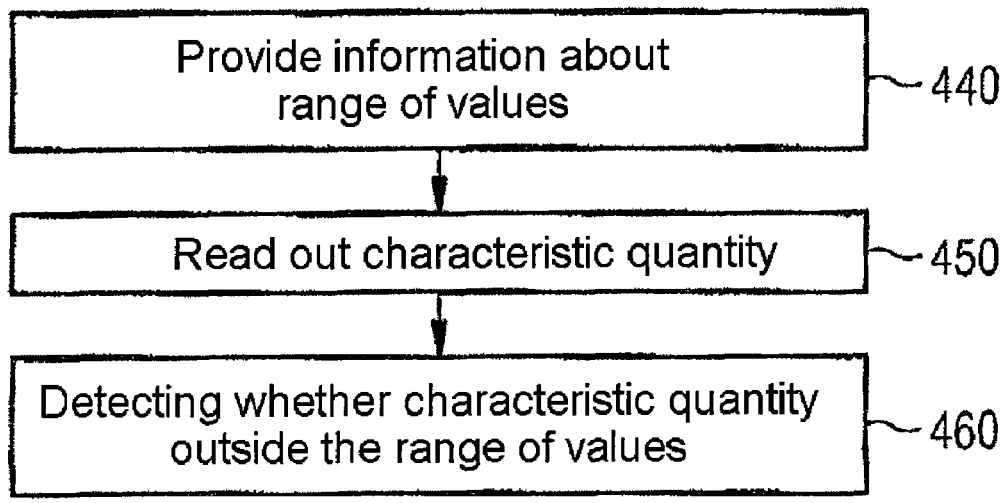
FIG. 4 shows a flow chart of an exemplary embodiment of reading from a memory cell.

FIG. 4 shows a flow chart of an exemplary embodiment of reading from the memory cell. The read-out comprises providing an item of information specifying the range of values, see block 440. Furthermore, the read-out comprises reading out the characteristic, see block 450, and detecting whether the characteristic read out lies outside the range of values, see block 460.

Figure 5:
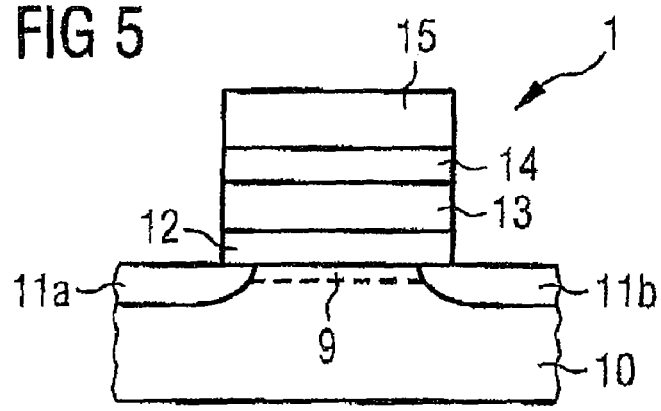
FIG. 5 shows a schematic illustration of an exemplary embodiment of a memory cell.

FIG. 5 shows a schematic illustration of an exemplary embodiment of a memory cell 1 with a transistor body, said memory cell being formed as a floating gate memory cell. The memory cell 1 comprises a substrate 10 with a first and a second doping zone 11a, 11b, between which a channel region 9 is situated. A first dielectric layer is applied to the substrate 10 in such a way that it covers at least regions of the doping zones 11a, 11b and of the channel region 9. A charge-storing floating gate 13 is arranged on the first dielectric layer 12, said floating gate being insulated from a gate electrode 15 by a second dielectric layer 14.

The first and second doping zones 11a, 11b and the gate electrode 15 serve as drain, source and control gate, respectively, of the transistor, to which voltages can be applied in order to generate tunneling currents with which the floating gate 13 can be charged or discharged. The charge stored in the floating gate 13 affects a threshold voltage of the memory cell 1. The threshold voltage is a voltage value which is to be applied to the gate electrode 15, such that a predetermined current flows between the doping zones 11a, 11b.

The reading process is effected by progressively applying one or more predetermined voltages to the gate electrode 15 and testing the transistor for continuity. During the reading process, only voltages which do not bring about any tunneling currents and hence any change in the information stored on the floating gate 13 are applied to the gate electrode 15 and also to the doping zones 11a, 11b serving as drain and source.

Figure 6:
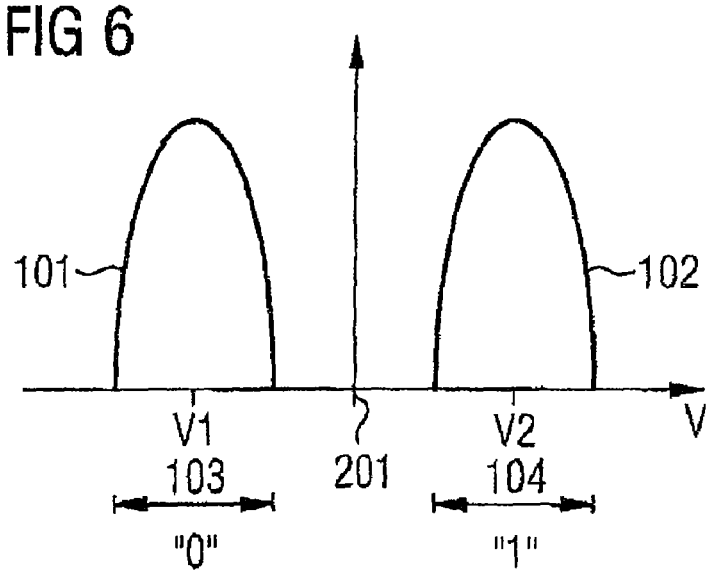
FIG. 6 shows a schematic illustration of an exemplary distribution of threshold voltages of a multiplicity of memory cells.

FIG. 6 shows an exemplary frequency distribution 101, 102 of threshold voltages V of a multiplicity of memory cells, which illustrates the conventional storage of information in memory cells.

A logic "0" is stored in approximately half of the memory cells, and a logic "1" is stored in the other half. In order to store a logic "0", the threshold voltage V in the memory cell is set in such a way that it has a first value V1 or almost the first value V1. The distribution 101 extends over a range 103 around the first value V1. In order to store a logic "1", the threshold voltage has a second value V2 or almost the second value V2. The distribution 102 extends over a range 104 around the second value V2. The threshold voltages V vary on account of parameter variations of the different memory cells. The parameter variations can be local oxide thickness fluctuations, local variations in the number of doping atoms, variations in the programming and erasing processes or the like. The distribution of the threshold voltages V is bimodal.

Provided that the ranges 103, 104 do not overlap, the bits can be reliably read out by choosing a read voltage 201 lying between the accumulation ranges 103, 104. Said read voltage 201 is applied to the gate electrode 15 during the reading process in order to detect whether the threshold voltage V lies above or below the read voltage 201.

In a further exemplary embodiment, two bits are stored in a floating gate memory transistor where four accumulation values are provided. The read voltages should be set between the accumulation ranges.

Figure 7:
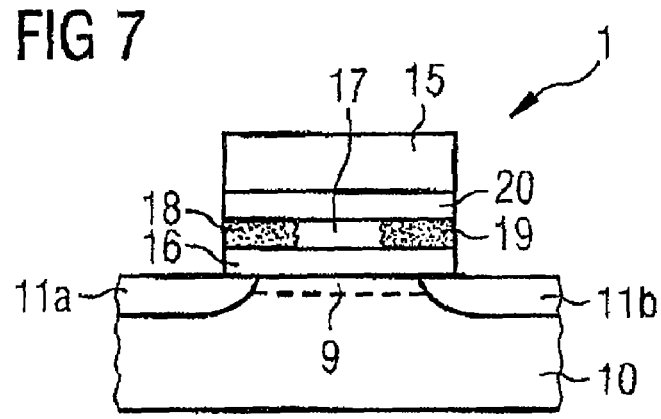
FIG. 7 shows a schematic illustration of a further exemplary embodiment of a memory cell.

FIG. 7 shows a further exemplary embodiment of a memory cell 1, in which a so-called ONO dielectric 16, 17, 20 is provided. The latter comprises a nitride layer 17 arranged between two oxide layers 16, 20. The ONO dielectric 16, 17, 20 insulates the gate electrode 15 from the channel region 9. Such a memory cell is referred to as an ONO memory cell or NROM memory cell, short for "nitride read only memory".

Injected charge carriers are stored in the nitride layer 17 or in deep trapping zones at the interfaces between the oxide layer and the nitride layer 17.

Since, in contrast to the floating gate memory cell, this exemplary embodiment does not use a conductive medium for storing injected charge carriers, two bits can be stored by local discrimination. A first bit is stored in a first storage region 18 of the nitride layer 17. A second bit is stored in a second storage region 19 of the nitride layer 17. These storage regions 18, 19 are represented in dotted fashion for illustration purposes in FIG. 7.

One of the bits is read out by detection of the current flowing from the first to the second doping zone 11a, 11b when the read voltages are applied. The other bit is read out by detection of the current flowing in the opposite direction. This makes use of the fact that the transistor current depends not only on the quantity of stored charge but also on which of the storage regions 18, 19 relative to the doping zone 11a and 11b, respectively, serving as source the charge is situated in. In one exemplary embodiment, rather than the threshold voltage a current criterion is used directly for reading when using this memory technology. Exemplary embodiments of ONO memory cells provide for the storage of a plurality of bits by further spatial discretization.

Figure 8:
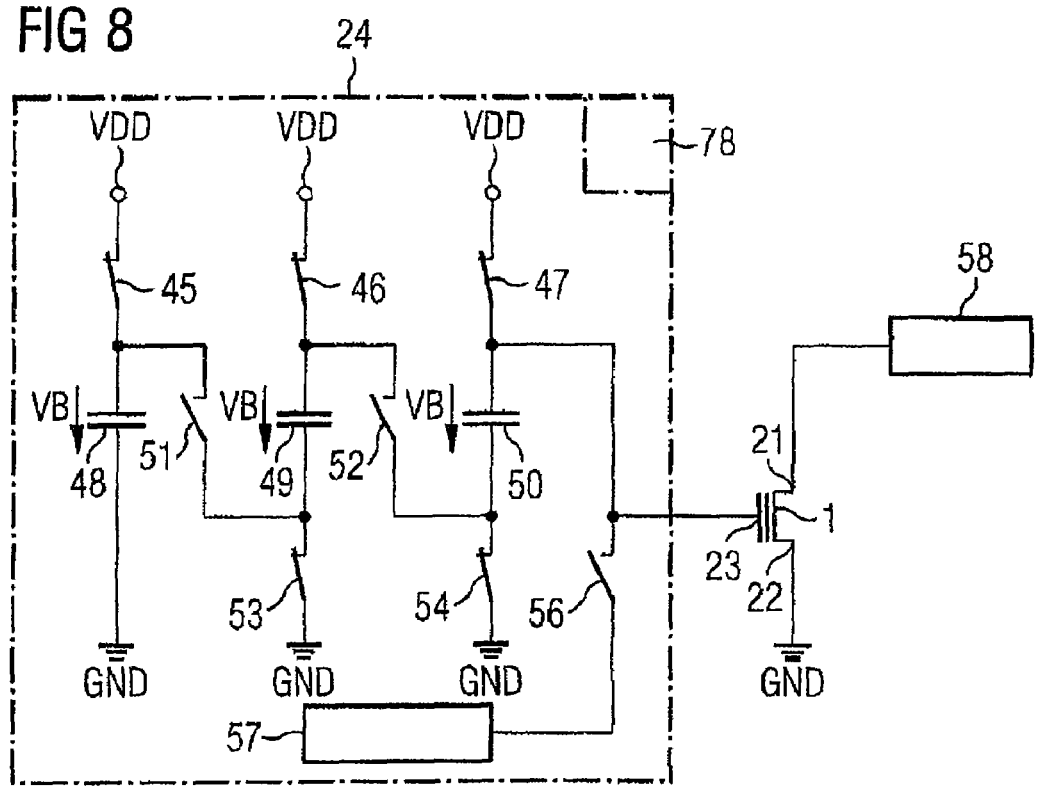
FIG. 8 shows a schematic illustration of an exemplary embodiment of a circuit arrangement with a first switch position.

FIG. 8 shows a schematic illustration of an exemplary embodiment of a circuit arrangement comprising a programming unit 24, by means of which a memory cell 1 coupled to a reading unit 58 can be programmed. The memory cell 1 has a first terminal 21, a second terminal 22 and a gate terminal 23 in order to apply voltages to the gate electrode and the doping zones.

The programming unit 24 is coupled to the gate terminal 23 of the memory cell 1. The memory cell 1 is coupled between the reading unit 58 and a reference potential terminal GND via the first and second terminals 21, 22. During normal operation, a first state is stored in the memory cell 1, said first state being interpreted as "no attack identified". During the booting of the circuit arrangement, the state of the memory cell 1 is read out. If the first state is read out, the booting process is effected in a predetermined manner. If a second state is read out, however, this is interpreted as "attack identified" and leads to suitable alarm measures, for example a delay of the booting process.

Terminals VDD, GND for providing a supply potential and the reference potential are provided in the programming unit 24. In the case of an attack, the memory cell 1 is programmed by the programming unit 24 with collapsing supply voltage, also referred to as power-down operation. For this purpose, during normal operation voltages VB are provided from which, in the case of an identified attack, even in the power-down operation mode, a programming voltage can still be generated which leads to a slight change in the stored quantity of charge in the memory cell 1.

During the subsequent booting of the circuit arrangement, it is evident on the basis of the stored information that an attack took place. The information "no attack identified" is allocated a narrow range of values of the threshold voltage, such that even small changes in the quantity of charge lead to a state change. This is detected as information "attack identified". In this case, the booting process is delayed by the desired period of time, for example of the order of magnitude of 10 seconds.

For generating the programming voltage, the programming unit 24 comprises a charge pump. The latter comprises a first capacitor 48 having a first and a second terminal. The first terminal is connected to the supply potential terminal VDD via a first switch 45. The second terminal is connected to the reference potential terminal GND. A second capacitor 49 having a first and a second terminal is furthermore provided, the first terminal of which is connected to the supply potential terminal VDD via a second switch 46, and the second terminal of which is connected to the reference potential terminal GND via a third switch 53. A third capacitor 50 has a first terminal, which is connected to the supply potential terminal VDD via a fourth switch 47, and a second terminal, which is connected to the reference potential terminal GND via a fifth switch 54. A sixth switch 51 connects the first terminal of the first capacitor 48 to the second terminal of the second capacitor 49. The first terminal of the second capacitor 49 is connected to the second terminal of the third capacitor 50 via a seventh switch 52. Further embodiments of the charge pump comprise fewer or more than three capacitors, which are connected up in accordance with the exemplary embodiment illustrated.

A changeover unit 78 is provided for changing over the programming unit to the power-down operation mode, said changeover unit interrupting the provision of the operating voltage and changing the switch position in the case of a detected attack.

Furthermore, the circuit arrangement is provided with a reset unit 57 for generating a reset voltage, which is connected to the gate terminal 23 of the memory cell 1 via an eighth switch 56.

In FIG. 8, the first, second, third, fourth and fifth switches 45, 46, 53, 47, 54 are illustrated as closed. The sixth, seventh and eighth switches 51, 52, 56 are illustrated as open. This first switch position is used during normal operation. It has the effect that the capacitances 48, 49, 50 are charged to the operating voltage VB present between the supply potential and reference potential terminals VDD, GND. The operating voltage is also present at the gate terminal 23, relative to the reference potential, but said operating voltage does not lead to charging processes on the floating gate or in a nitride layer of an ONO memory cell.

Figure 9:
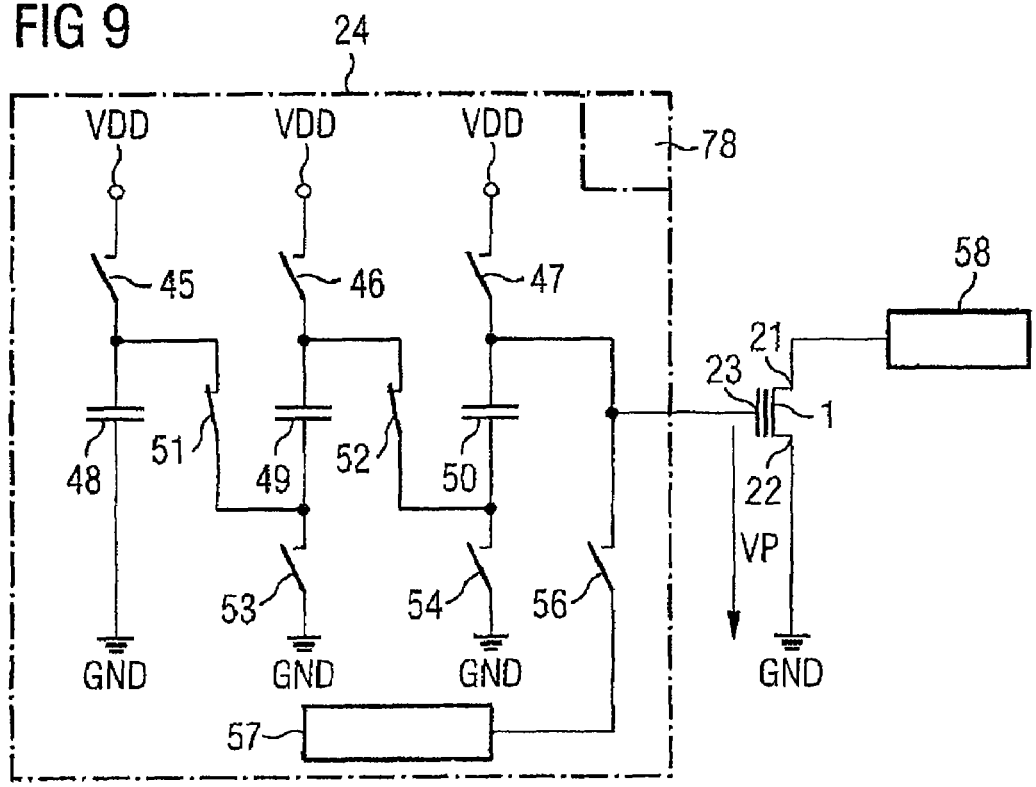
FIG. 9 shows a schematic illustration of the exemplary embodiment of the circuit arrangement with a second switch position.

FIG. 9 shows the exemplary embodiment of the circuit arrangement from FIG. 8 with a second switch position. In order to avoid repetition, description of the corresponding features is dispensed with and only the differences are discussed.

In the case of an identified attack, the first, second, third, fourth and fifth switches 45, 46, 53, 47, 54 are opened. The sixth and seventh switches 51, 52 are closed. As a result, the stored voltages present at the capacitances are added, which leads to a high programming voltage VP at the gate terminal 23. Said voltage, in one exemplary embodiment of the memory cell 1, brings about the injection of electrons from the channel region of the memory cell 1 into the floating gate of a floating gate memory cell. Said voltage, in another exemplary embodiment of the memory cell 1, brings about the injection of electrons from the channel region of the memory cell 1 into the nitride layer of an NROM memory cell.

Figure 10:
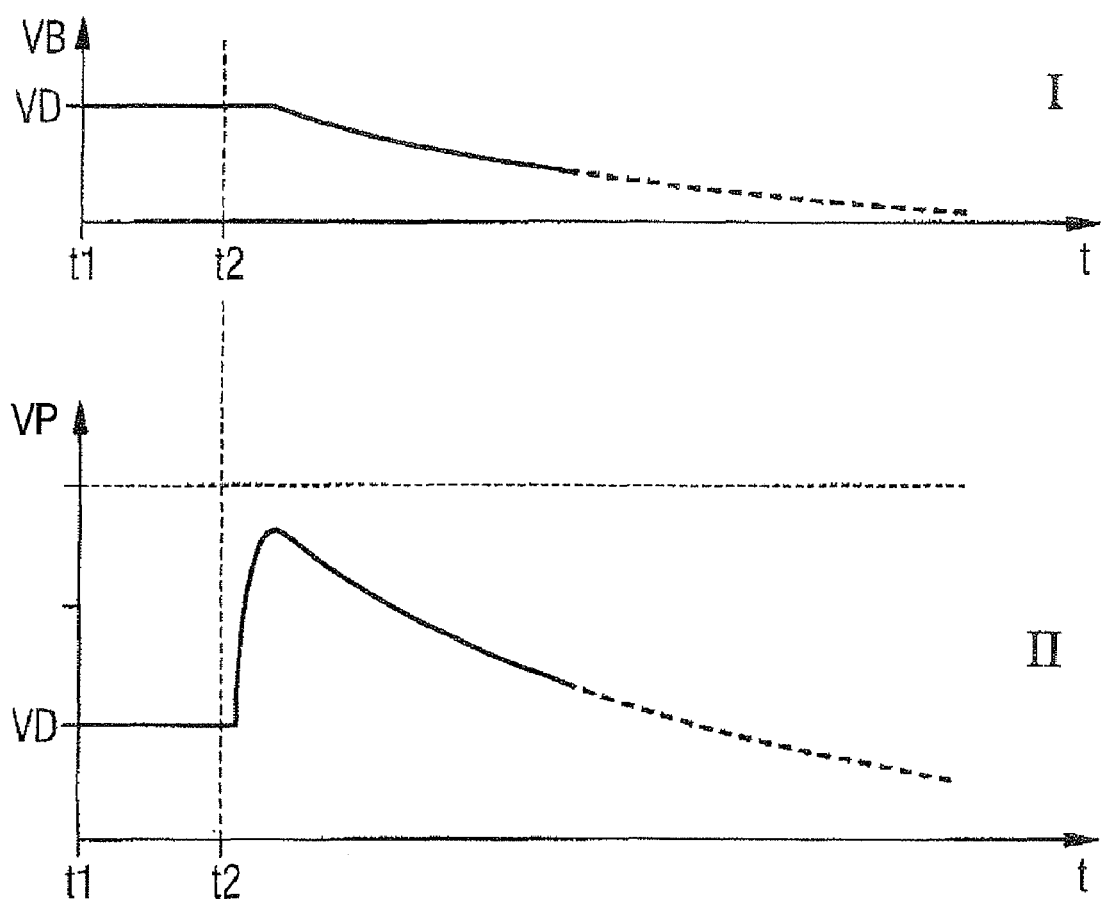
FIG. 10 shows schematic timing diagrams of signals which occur in the exemplary embodiment of the circuit arrangement.

FIG. 10 shows a time profile of the operating voltage VB, see I, and of the programming voltage VP present at the gate terminal 23, see II.

At an instant t1 during normal operation, both the operating voltage VB and the programming voltage VP have a nominal value VD.

At the instant t2, an attack is detected, which leads to initiation of the power-down operation mode. Consequently, the operating voltage VB decreases continuously. At the instant t2, the changeover to the second switch position of the charge pump is also effected, whereby the programming voltage VP rises abruptly. The maximum value of the programming voltage VP that can be achieved theoretically is 3VD in the configuration shown. Leakage currents and parasitic capacitances and also the fact that the power-down operation mode is also initiated in parallel with the identified attack have the effect that said voltage is not quite reached and a transient current profile having the character of an analog signal results. A precise prediction of said profile is not required. What is important is that a sufficiently high programming voltage VP which brings about a sufficient shift in the threshold voltage V of the memory cell 1 is only present at the memory cell 1 for a sufficiently long time.

A sufficient shift results because the quantity of charge associated with the first state, "no attack identified", or the electrical characteristic read therefrom is only allocated a narrow window, such that a slight change in said quantity of charge brings about a state change. The quantity of charge required to shift the characteristic from the window is smaller than the quantity of charge required to change a bit in the case of conventional programming.

Figure 11:
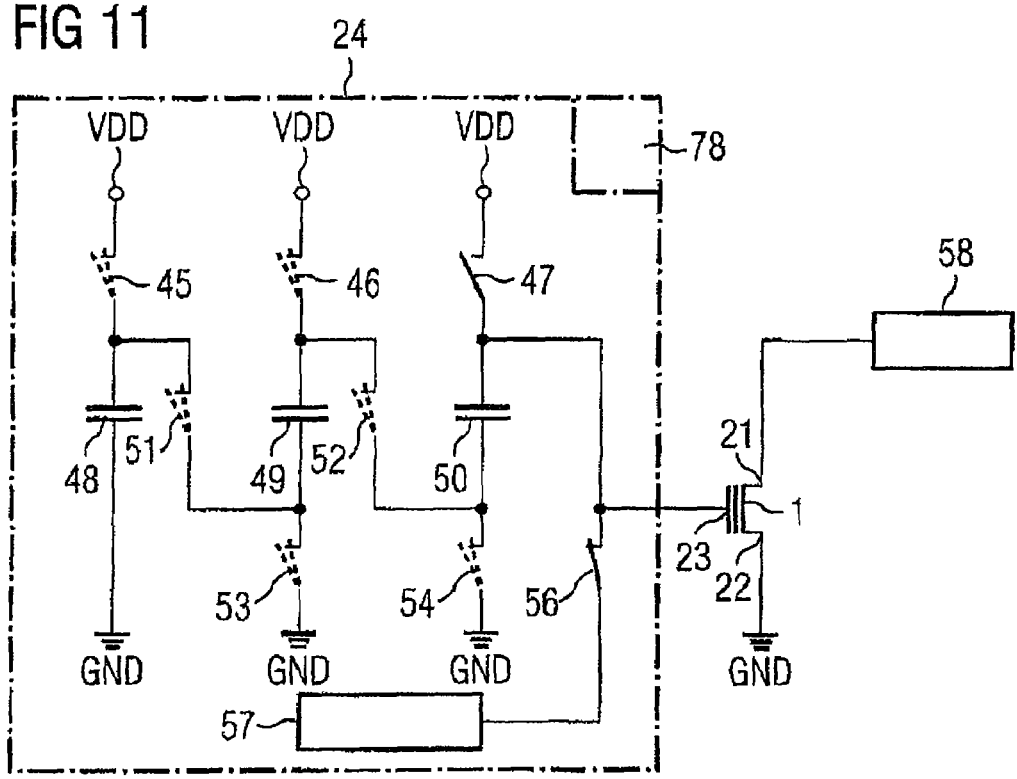
FIG. 11 shows a schematic illustration of the exemplary embodiment of the circuit arrangement with a third switch position.

FIG. 11 shows a third switch position of the exemplary embodiment of the circuit arrangement from FIGS. 8 and 9 during a booting process effected after an identified attack, in order to reset the memory cell 1 into the first state again.

For resetting, the reset voltage provided by the reset unit 57 is applied to the gate terminal 23 via the eighth switch 56. The fourth switch 47 is open. The position of the other switches 45, 46, 51, 52, 53, 54 is not of importance for the resetting.

The reset voltage is a moderately high negative voltage which leads to a reduction of negative charges on the floating gate or in the storage plane of the ONO dielectric. In one exemplary embodiment, a progressive write-read method is applied in which the application of the reset voltage and the reading of the memory transistor are carried out progressively until the stored quantity of charge again corresponds to the first state.

Figure 12:
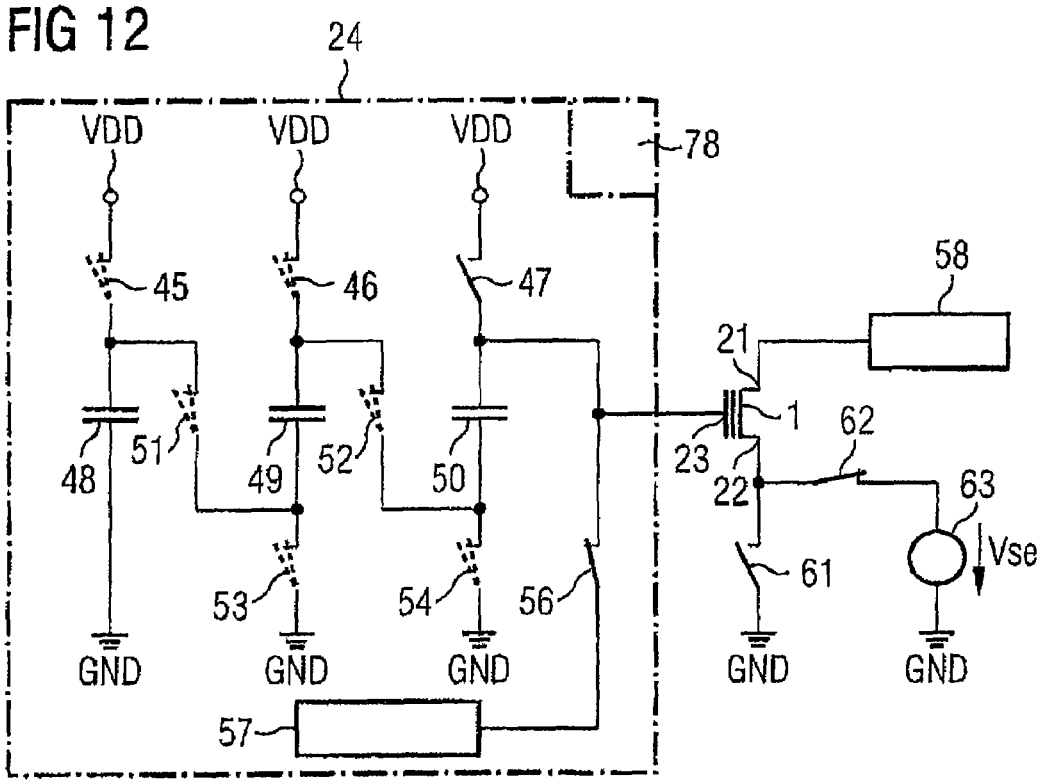
FIG. 12 shows a schematic illustration of an exemplary embodiment of a circuit arrangement.

FIG. 12 shows a further exemplary embodiment of a circuit arrangement. Identical reference symbols designate identical features. The description of features corresponding to the previous exemplary embodiment is dispensed with.

The exemplary embodiment in FIG. 12 differs from the previous exemplary embodiment by virtue of the fact that a ninth switch 61 is connected to the second terminal 22 of the memory cell 1, said ninth switch being connected to the reference potential terminal GND, and that there is a tenth switch 62 connected to a voltage source 63. The voltage source 63 provides a positive voltage Vse.

For resetting, the ninth switch 61 is open and the tenth switch 62 is closed. As in the previous exemplary embodiment, the eighth switch 56 is closed and the fourth switch 47 is open.

This switch position enables resetting by virtue of the tunneling current flowing from the floating gate or from the storage plane in the ONO dielectric essentially via the source edge of the memory cell 1. In this region, the electric field is at a maximum as a result of the application of the positive voltage Vse in conjunction with a negative reset voltage of high magnitude at the gate terminal 23. During programming and during normal operation, the ninth switch 61 is closed and the tenth switch 62 is open. With regard to the switch position of the other switches, the explanations concerning the previous exemplary embodiment also apply to the exemplary embodiment in FIG. 12.

In the above-described type of programming and during resetting, the charge is changed by means of a so-called Fowler-Nordheim injection.

Figure 16:
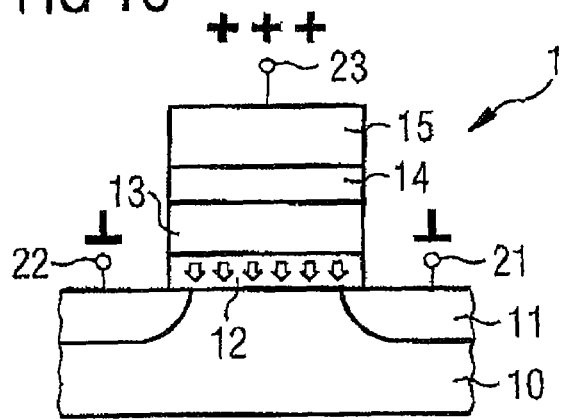
FIG. 16 shows an illustration of an exemplary embodiment of the programming of a memory cell.

FIG. 16 illustrates the Fowler-Nordheim injection in the case of a memory cell 1 formed by way of example as a floating gate memory cell. A high positive voltage is applied to the gate terminal 23, and the other terminals 21, 22 are at the reference potential. It should be noted that the programming in FIG. 13 is illustrated on the basis of a memory cell formed as an n-MOS transistor. This results in an inversion channel in the transistor and a homogeneous electric field in the interface region between the channel and the adjoining doping zones 11a, 11b and the storage plane. This consequently results in an electron injection current distributed homogeneously over the channel region in the direction of the storage plane.

The arrows depicted symbolize the injection current density. They point in the technical current direction, such that the potential of the storage plane 13 decreases in the case shown. In principle, the injection current increases with higher voltage applied to the gate terminal 23. However, the maximum value is limited by reliability criteria, for example damage to the dielectric through to breakdown. Consequently, only moderate injection currents are possible, such that the programming times typically turn out to be relatively long. This procedure proceeds at comparatively low power. The total power dissipated in the transistor results from the product of applied voltage and injection current. Although the high programming voltage has to be generated by means of lossy voltage pumps in the periphery, the requirement made of the current driving capacity of said pumps is only moderate on account of the small currents required for the programming.

In order to raise the potential of the storage plane again, a high negative voltage is applied to the gate terminal 23. Similar channel-free conditions with a similar power loss budget occur in this case. However, it is also conceivable to apply a high negative voltage to the gate terminal 23 and a positive voltage to the first and second terminals, in a similar manner to how this is carried out in the exemplary embodiment in FIG. 12. However, leakage currents can occur in edge regions of the doping zones 11a, 11b. In one exemplary embodiment, however, the voltage made available possibly collapses rapidly on account of the power-down operation mode that is simultaneously initiated.

Figure 17:
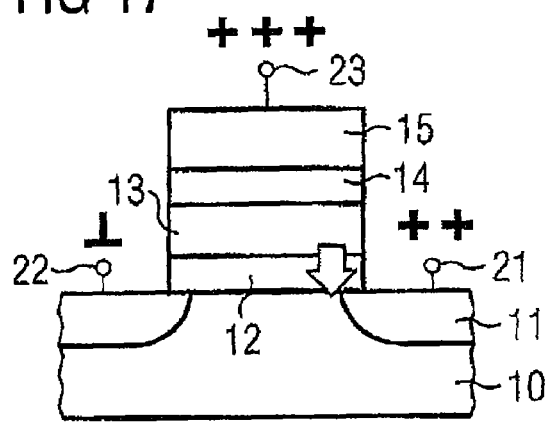
FIG. 17 shows an illustration of a further exemplary embodiment of the programming of a memory cell.

FIG. 17 shows the programming by means of so-called channel hot electron injection, such as could be effected for example if the switch position of the ninth and tenth switches 61, 62 as illustrated in the exemplary embodiment of FIG. 12 is also used during the programming process. It should be noted that the programming in FIG. 17 is illustrated on the basis of the memory cell formed as an n-MOS transistor.

In the case of channel hot electron injection, the programming voltage applied to the gate terminal 23 is above the threshold voltage. A positive voltage is also applied to the second terminal 22, such that a very high lateral field forms directly before the drain junction. The high-field region is short in comparison with the total gate length or channel length. The increase in the lateral field in the channel region is highly nonlinear. The channel charge carriers take up a very large amount of energy within said high-field region. However, they do not move ballistically, rather impact processes occur in which secondary electron-hole pairs are generated and some charge carriers are deflected in the direction of the dielectric above the silicon substrate. A portion of said charge carriers can overcome the energy barrier with respect to the dielectric and tunnel into the dielectric. If the vertical electric field additionally acts attractively for the injected electrons, the latter move further in the direction of the storage plane and change the charge state thereof. In order to generate these conditions, alongside a high drain voltage at the first terminal 21, in addition an at least equally high, often also an even somewhat greater gate voltage is applied to the gate terminal 23. The transistor is operated in strong inversion under these conditions.

On account of the high channel current, this method is highly power-intensive. Firstly, the transistor to be programmed itself dissipates a large amount of power dependent on the product of applied drain voltage and drain or channel current. Lossy voltage pumps generating a high programming voltage with a high current driving capacity have to be provided in the periphery of the memory components, which is associated with an increased power loss. This method has short programming time.

An alternative form of programming is firstly described below on the basis of a further exemplary embodiment of the circuit arrangement.

FIG. 13 shows a programming unit 24 with a charge pump which can be coupled to the first terminal 21 of the memory cell 1 via an eleventh switch 59. Said first terminal 21 can be coupled to the reading unit 58 via a twelfth switch 60. The gate terminal 23 is coupled to the reset unit 57 and the reference potential terminal GND via a thirteenth and fourteenth switch 65, 66, respectively.

In the normal operation mode illustrated, the first, second, third, fourth and fifth switches 45, 46, 53, 47, 54 are closed. The sixth and seventh switches 51, 52 are open. The capacitances 48, 49, 50 are charged in this switch position. The memory cell 1 is decoupled from the charge pump, however, via the eleventh switch 59, which is open. The twelfth switch 60 is closed, such that the memory cell 1 is connected to the reading unit 58 and can be read.

FIG. 14 shows a second switch position in the case of a detected attack for this exemplary embodiment of the circuit arrangement. In the case of an identified attack, the switches 45, 46, 47, 51, 52, 53, 53 of the charge pump are switched to the second switch position. Furthermore, the reading unit 58 is isolated from the first terminal 21, and the programming voltage VP is applied to the first terminal 21 by means of the eleventh switch 56 being closed. The voltage applied to the gate terminal 23 is not changed. On account of the positive voltage between the first terminal 21 and the gate terminal 23, holes tunnel into the charge-storing layer.

In one exemplary embodiment, the information "no attack identified" is assigned to a quantity of charge on the floating gate of the memory cell, which, when the reference potential is applied to the gate terminal, brings about a potential on the floating gate which puts the transistor at an operating point in the range of moderate inversion. In such a configuration, the transistor can be read in the normal operation mode, as illustrated in FIG. 13. In the case of an identified attack, it is only necessary for the read voltage to be isolated from the drain and the transient high voltage to be applied to the drain. By contrast, the voltage at the gate terminal does not have to be changed, as illustrated in FIG. 14.

Figure 15:
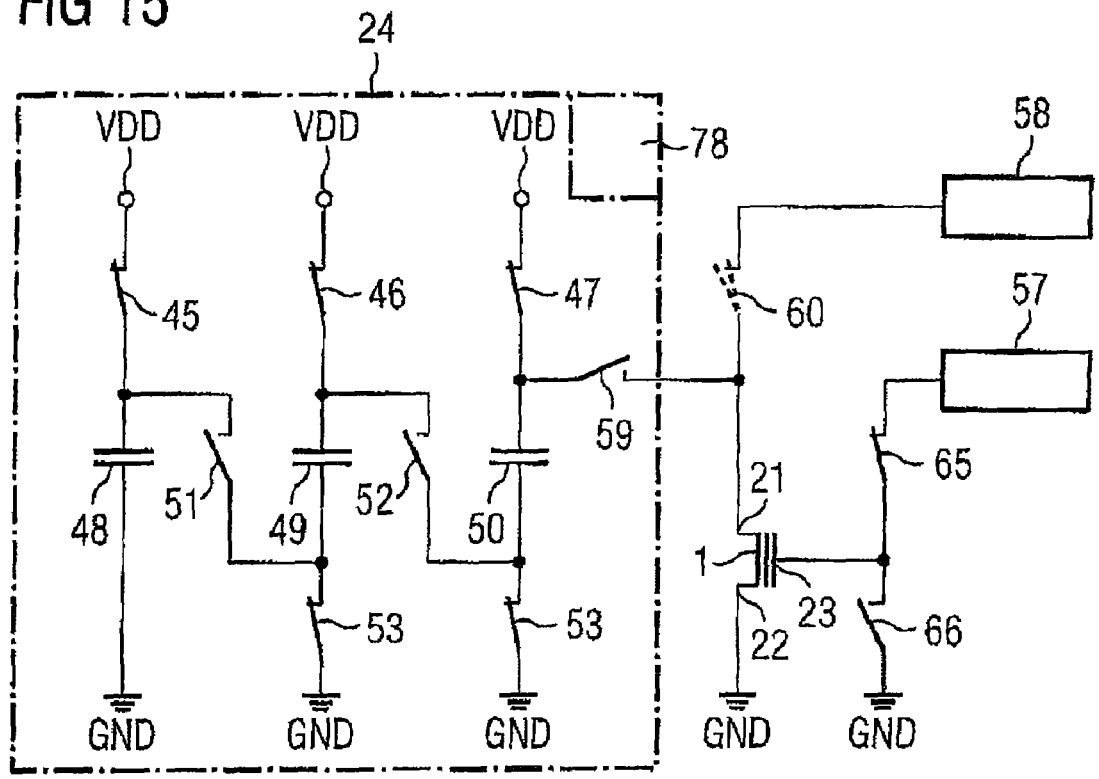
FIG. 15 shows a schematic illustration of the further exemplary embodiment of the circuit arrangement with a third switch position.

FIG. 15 shows a third switch position during booting after an identified attack for this exemplary embodiment of the circuit arrangement. The memory cell 1 is reset by the reset unit 57 being coupled to the control gate 23 via the thirteenth switch 65. As a result, a high positive voltage is applied to the control gate 23, which leads to an electron injection by Fowler-Nordheim tunneling by means of which the injected holes introduced previously during the attack are neutralized.

Figure 18:
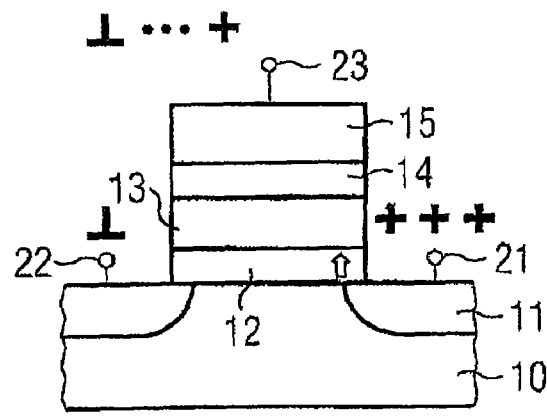
FIG. 18 shows an illustration of an exemplary embodiment of the programming of a memory cell.

In the above exemplary embodiment, the charge introduction is effected by means of so-called channel hot hole injection, as illustrated in FIG. 18. It should be noted that the programming in FIG. 18 is illustrated on the basis of a memory cell formed as an n-MOS transistor. The transistor is operated at an operating point in moderate inversion and with a high drain voltage. In the case of a conventionally operated transistor, this is done by applying a gate voltage in the region of, i.e. near or just above, the threshold voltage. However, significantly lower gate voltages are also conceivable. On the basis of this condition, a channel current occurs which is small, however, since a relatively high lateral field results directly before the drain terminal. The channel current is significantly smaller than under channel hot electron injection conditions. However, a higher lateral field forms directly before the drain junction. In the high-field region, the channel charge carriers take up a very large amount of energy and impact processes occur in which secondary electron-hole pairs are generated. The holes thus generated also in turn take up a very large amount of energy in said field. Some of them are deflected in the direction of the dielectric above the silicon, can overcome the energy barrier with respect to the dielectric and tunnel through the dielectric, especially as the local vertical field conditions are also active in the oxide.

The following situation results here in comparison with channel hot electron injection: the injection rate is higher since the lateral electric field is greater. The channel current is significantly smaller on account of the operating point in moderate inversion. The injection current, that is to say the product of injection rate and channel current, turns out to be smaller, but to a lesser extent than the channel current. The consequence of this is that although this method is slower than channel hot electron programming, it requires less power both in the transistor and in the peripheral circuit and in total is more energy efficient. On account of this, the energy consumption is lower during the programming process in the power-down operation mode, such that the loading of the high programming voltage made available transiently turns out to be lower than in the case of channel hot electron programming. This programming is fast, and the voltage is sufficiently stable.

In an alternative exemplary embodiment, a p-MOS transistor is used as memory transistor 1. An analogous operating point is applicable for the programming. The voltages are equal in magnitude but have inverted signs with respect to the situation in n-MOS transistors. In this case, electrons are injected through the tunnel oxide, which are firstly generated in an impact ionization process in the high-field region near the drain, since the channel charge carriers here are holes. The energy barrier with respect to the tunnel oxide for electrons is lower than for holes, which in turn means that a higher injection rate is obtained giving the same ratio of high-energy charge carriers generated in the channel region to channel current.

A description is given below of how the memory cell is read in one exemplary embodiment.

FIG. 19 shows an exemplary embodiment of the circuit arrangement with the reading unit—illustrated in detail—for reading from the memory cell 1. The memory cell 1 is coupled to the programming unit 24 by way of example via the gate terminal 23. It is also conceivable, of course, for said coupling to be effected via the first terminal 21, as described above in the exemplary embodiments relating to the programming unit 24.

The second terminal 22 of the memory cell 1 is connected to the reference potential terminal GND. The first terminal 21 is coupled to the supply potential terminal VDD via a load element 23, in the simplest case a nonreactive resistor. Alternative configurations of the load element are also conceivable, for example as load transistor in current source or diode configuration.

Between the load element 32 and the first terminal 21 there is a connection to a comparator unit comprising a first comparator 25 and a second comparator 28. A first voltage source 39 is coupled to a first input 26 of the first comparator 25. A second voltage source 40 is coupled to a first input 30 of the second comparator 28. Second inputs 27, 29 of the two comparators 25, 28 are coupled to one another and connected to the first terminal 21 of the memory cell 1. The first voltage source 39 specifies an upper limit of the voltage to be compared at the two inputs 27, 29. The second voltage source 40 predetermines a lower limit.

The first comparator compares whether the voltage at the first terminal 21 is less than the upper limit $V0+\frac{1}{2} \Delta V0$, and the second comparator compares whether said voltage is greater than the lower limit $V0-\frac{1}{2} \Delta V0$. The outputs of the comparators 25, 28 are coupled to one another via a logic AND combination 31. This arrangement 25, 28, 31 can be used to detect whether the voltage tapped off at the first terminal 21 of the memory cell 1 lies within the range predetermined by the window comparator 25, 28. In this case, the memory cell 1 has the first state, which indicates that an attack has not taken place. If the tapped-off voltage lies outside the range checked by the window comparator, this indicates an attack. The memory cell 2 has the second state. A sufficiently narrow window is achieved for example by choosing $\Delta V0$ within the range of a few millivolts to umpteen millivolts. In contrast thereto, the differences between the accumulation points, as illustrated in FIG. 6, in the case of conventional programming, are usually one to three volts.

Since the threshold voltage is usually shifted only in one direction during the programming, in one exemplary embodiment, instead of the window comparator 25, 28, only one comparator 25 is provided, which checks whether the threshold voltage has exceeded a predetermined limit value. In this case, the memory cell 1 has the second state.

Fluctuation of the operating temperature, fluctuation of the operating voltage, aging effects and the like can lead to the read-out characteristic being shifted in a manner not governed by an attack. During a booting process this may lead to an erroneous interpretation as "attack identified". Although such an interpretation does not diminish the security, it can have a disturbing effect for the user due to the lengthier booting process.

FIG. 20 shows an exemplary embodiment of a circuit arrangement with a reading unit in which this effect is avoided. The circuit arrangement illustrated in FIG. 20 is of differential design. It differs from the preceding exemplary embodiment in FIG. 19 by virtue of the fact that a reference cell 33 having a first terminal 34 and having a second terminal 35 and a control gate 36 is provided. In the same way as the memory cell 1, the reference cell 33 is coupled to the reference potential GND and, via a load element 37, to the supply voltage VDD.

This exemplary embodiment furthermore differs from the preceding exemplary embodiment by virtue of the fact that the voltages tapped off at the first terminals 21, 34 are fed to a differential amplifier 38 having a defined gain. The output of the differential amplifier 38 is coupled to the window comparator 25, 28. Fluctuation of the operating temperature and similar effects are compensated for by this configuration since they affect both the memory cell 1 and the reference cell 33 and influence the tapped-off voltage in the same way.

Figure 21:
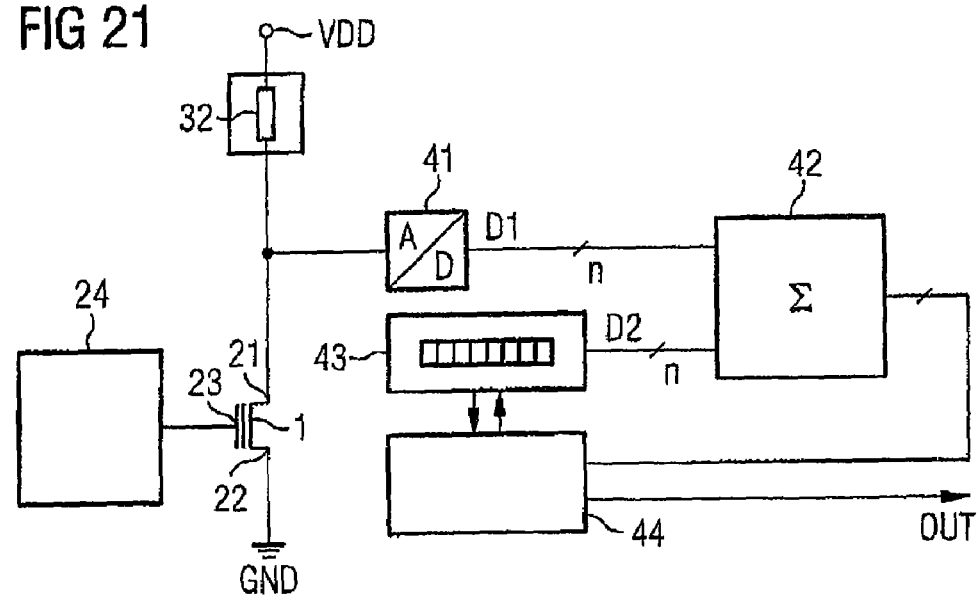
FIG. 21 shows a schematic illustration of an exemplary embodiment of a circuit arrangement.

FIG. 21 shows a sixth exemplary embodiment with a reading unit configured in an alternative manner. The first terminal 21 of the memory cell 1 is coupled to an analog-to-digital converter 41. A memory 43 is furthermore provided, which, in the same way as the analog-to-digital converter 41, is coupled to a comparison unit 42. The comparison unit 42 is coupled to a control unit 44, which can also access the memory 43.

The voltage tapped off at the first terminal 21 is converted into a digital n-bit word D1. Said n-bit word D1 is compared with an n-bit word D2 stored in the memory 43 by means of the comparison device 42 to the effect of whether the word D1 at the output of the analog-to-digital converter 41 corresponds to a predetermined word D2. The bitwise complement of a predetermined word is stored. The comparison device 42 is formed as a bitwise adder. The stored n-bit word D2 acquires the digital complement, such that in the case where no attack took place, the sum of the words is zero.

The comparison need not necessarily be effected by summation. As an alternative, further memory elements can store the predetermined word which is compared with the output of the analog-to-digital converter 41. Digital difference formation is effected in this case.

The two words are compared in the digital domain, where equality means "no attack identified". The embodiments of the comparison units are equivalent at the system level since the analog-to-digital conversion is based on a discretization operation and since the voltage tapped off at the memory cell 1 is assigned an interval.

In the case of an identified attack, the state in the memory cell 1 is changed. During the next booting process, it is conceivable to reverse the state change as described in the previous exemplary embodiments. One exemplary embodiment provides for changing the n-bit word stored digitally on the card and used for the comparison.

In one exemplary embodiment, the stored word is stored in an invariable manner in a simple logic circuit by means of hardwired elements. In this case, the word cannot be changed and the information change after an identified attack must be reversed directly, as before as well.

Figure 22:
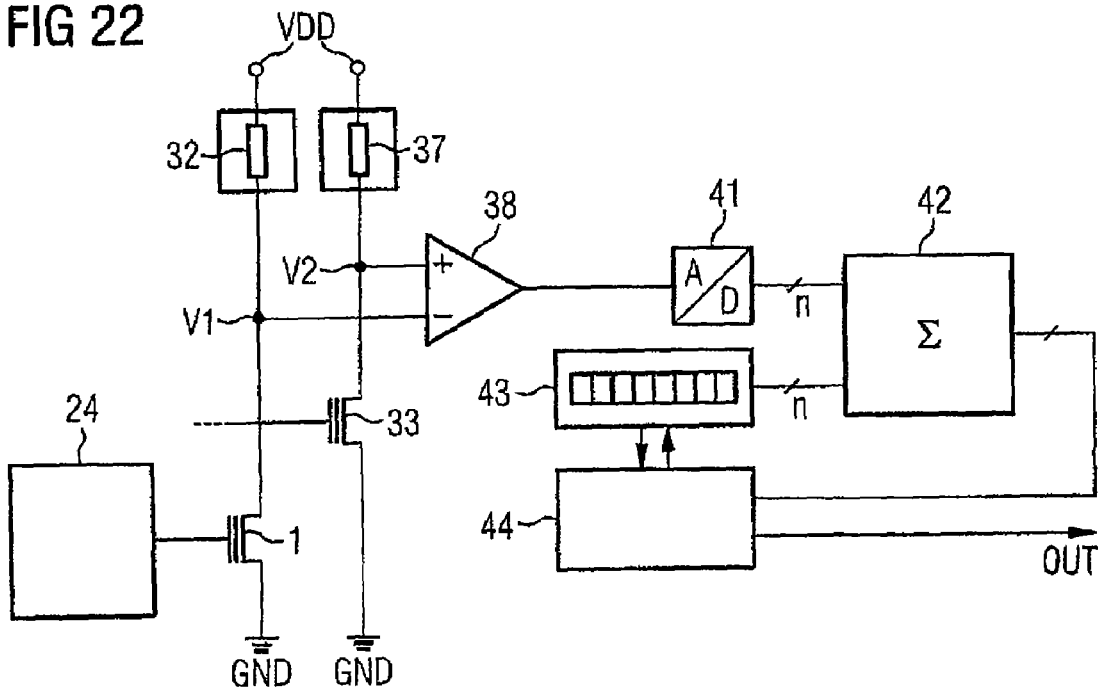
FIG. 22 shows a schematic illustration of a further exemplary embodiment of a circuit arrangement.

FIG. 22 shows an exemplary embodiment of a circuit arrangement with the reading unit in which the characteristic is detected differentially. The reference cell 33 and the differential amplifier 38 are provided for this purpose. These features have already been described in FIG. 20. In the exemplary embodiment of FIG. 22, the analog-to-digital conversion is effected at the output of the differential amplifier 38.

The invention claimed is:

1. A circuit arrangement comprising:
   a nonvolatile memory cell comprising a continuously variable characteristic that can be read out;
   a programming unit, which is coupled to the memory cell and which is designed to apply an analog signal to the memory cell in order to vary the characteristic, if the characteristic lies within a predetermined range of values, in such a way that the characteristic lies outside the predetermined range of values; and
   a changeover unit, which is coupled to a supply voltage unit and to the programming unit and is designed to trigger the application of the analog signal to the memory cell if a supply voltage is interrupted.

2. The circuit arrangement as claimed in claim 1, further comprising a reading unit, which is coupled to the nonvolatile memory cell and is designed to detect whether the characteristic read out lies outside the predetermined range of values.

3. The circuit arrangement as claimed in claim 2, wherein the reading unit comprises:
   a read-out unit with a potential node, which is coupled to the memory cell and is designed to read out the characteristic and to provide a characteristic value at the potential node; and
   a comparison unit, which is coupled to the potential node and is designed to detect whether the characteristic value lies outside the predetermined range of values.

4. The circuit arrangement as claimed in claim 3, wherein the read-out unit comprises a reference cell having a characteristic, which remains unchanged if the supply voltage is interrupted.

5. The circuit arrangement as claimed in claim 4, wherein the read-out unit comprises a differential amplifier, to which the memory cell and the reference cell are coupled on the input side and to which the potential node is coupled on the output side.

6. The circuit arrangement as claimed in claim 3, wherein the comparison unit comprises at least one comparator to which at least one limit voltage and the potential node are coupled.

7. The circuit arrangement as claimed in claim 3, wherein the comparison unit comprises an analog-to-digital converter, which is coupled to the potential node in order to assign a first digital value to the characteristic value.

8. The circuit arrangement as claimed in claim 7, wherein the comparison unit comprises a digital comparison device, which is coupled to the analog-to-digital converter and is designed to compare the first digital value and a predetermined second digital value.

9. The circuit arrangement as claimed in claim 8, wherein the second digital value is variable.

10. The circuit arrangement as claimed in claim 1, further comprising a reset device, which is designed to vary the characteristic lying outside the predetermined range of values, such that the characteristic lies within the predetermined range of values.

11. The circuit arrangement as claimed in claim 1, wherein charges can be introduced into a charge-storing region of the memory cell by means of hot hole injection.

12. A circuit arrangement comprising:
   a nonvolatile memory cell having a continuously variable characteristic that can be read out, wherein the memory cell comprises a first terminal, a second terminal and a gate terminal, wherein the second terminal is connected to a potential node;
   a programming unit, which is connected to the gate terminal of the memory cell, wherein the programming unit is designed to apply an analog signal to the memory cell in order to vary the characteristic, if the characteristic lies within a predetermined range of values, in such a way that the characteristic lies outside the predetermined range of values;
   a changeover unit, which is coupled to a supply voltage unit and to the programming unit and is designed to trigger the application of the analog signal to the memory cell if a supply voltage is interrupted; and
   a reading unit, which is connected to the first terminal of the memory cell and is designed to detect whether the characteristic read out lies outside the predetermined range of values.

13. The circuit arrangement as claimed in claim 12, wherein the magnitide of the analog signal is both greater than a magnitude of a potential present at the first terminal and greater than a magnitude of a potential present at the second terminal.

14. A circuit arrangement comprising:
   a nonvolatile memory cell having a continuously variable characteristic that can be read out, wherein the memory cell comprises a first terminal, a second terminal and a gate terminal, wherein the gate terminal is connected to a first potential node and the second terminal is connected to a second potential node;

a programming unit, which can be connected to the first terminal of the memory cell, such that an analog signal is applied to the memory cell in order to vary the characteristic, if the characteristic lies within a predetermined range of values, in such a way that the characteristic lies outside the predetermined range of values;

a changeover unit, which is coupled to a supply voltage unit and to the programming unit and is designed to trigger the application of the analog signal to the memory cell if a supply voltage is interrupted; and a reading unit, which is connected to the first terminal of the memory cell and is designed to detect whether the characteristic read out lies outside the predetermined range of values.

15. The circuit arrangement as claimed in claim 14, wherein charges can be introduced into a charge-storing region of the memory cell by means of hot hole injection.

16. The circuit arrangement as claimed in claim 14, wherein the gate terminal is connected to a reset unit which is designed to provide a reset voltage.

* * * * *